United States Patent
Lin et al.

(10) Patent No.: US 9,666,711 B1
(45) Date of Patent: May 30, 2017

(54) SEMICONDUCTOR DEVICE AND METHOD FOR MANUFACTURING THE SAME

(71) Applicant: Vanguard International Semiconductor Corporation, Hsinchu (TW)

(72) Inventors: Wen-Hsin Lin, Jhubei (TW); Shin-Cheng Lin, Tainan (TW)

(73) Assignee: VANGUARD INTERNATIONAL SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 15/168,792

(22) Filed: May 31, 2016

(51) Int. Cl.
*H01L 29/78* (2006.01)
*H01L 29/06* (2006.01)
*H01L 29/10* (2006.01)
*H01L 29/66* (2006.01)

(52) U.S. Cl.
CPC ........ *H01L 29/7816* (2013.01); *H01L 29/063* (2013.01); *H01L 29/1095* (2013.01); *H01L 29/66681* (2013.01)

(58) Field of Classification Search
CPC ............. H01L 29/7835; H01L 29/7833; H01L 29/66659; H01L 29/66681
See application file for complete search history.

(56) References Cited

U.S. PATENT DOCUMENTS

| | | | | |
|---|---|---|---|---|
| 7,932,558 B2* | 4/2011 | Kobayashi | .......... | H01L 29/0847 257/335 |
| 2012/0193709 A1* | 8/2012 | Sukegawa | ....... | H01L 21/823807 257/337 |
| 2015/0054071 A1* | 2/2015 | Chou | .................. | H01L 29/1045 257/336 |

FOREIGN PATENT DOCUMENTS

TW        201547023 A        12/2015

* cited by examiner

*Primary Examiner* — Matthew Landau
*Assistant Examiner* — Scott Stowe
(74) *Attorney, Agent, or Firm* — Birch, Stewart, Kolasch & Birch, LLP

(57) ABSTRACT

A semiconductor device is provided. The semiconductor device includes a first conductive type substrate; a second conductive type body region disposed in the first conductive type substrate, wherein the first conductive type is different from the second conductive type; a first conductive type first well region disposed in the second conductive type body region; a gate structure disposed over the top surface of the first conductive type substrate; a source region, wherein the source region includes a heavily-doped first conductive type source region and is disposed in the second conductive type body region; and a drain region, wherein the drain region is heavily doped first conductive type and is disposed in the first conductive type first well region.

18 Claims, 4 Drawing Sheets

SEMICONDUCTOR DEVICE AND METHOD FOR MANUFACTURING THE SAME

BACKGROUND OF THE INVENTION

Field of the Invention

The disclosure relates to semiconductor technology, and in particular to a semiconductor device and a method for manufacturing the same.

Description of the Related Art

High-voltage semiconductor devices are applied in integrated circuits with high voltage and high power. Traditional high-voltage semiconductor devices, such as laterally diffused metal oxide semiconductors (LDMOS), are mainly used in devices with at least 18 volts or higher. The advantages of high-voltage device technology include cost effectiveness and process compatibility. High-voltage device technology has been widely used in display driver IC devices, power supply devices, power management fields, communications fields, autotronics fields, industrial control fields, etc.

Usually, high-voltage semiconductor devices use N-type metal-oxide-semiconductors (NMOS) rather than P-type metal-oxide-semiconductors (PMOS), and the N-type metal-oxide-semiconductor is usually disposed on a P-type substrate. However, existing semiconductor devices have not been satisfactory in every respect. For example, if an N-type metal-oxide-semiconductor and a P-type metal-oxide-semiconductor are to be disposed on a P-type substrate at the same time, one or a plurality of epitaxial processes are needed to form the P-type metal-oxide-semiconductor on the P-type substrate. However, these manufacturing steps are difficult, and the cost is high.

Therefore, a simple and cost-effective method that may form a P-type metal-oxide-semiconductor on a P-type substrate is needed so that those skilled in the art may form an N-type metal-oxide-semiconductor and P-type metal-oxide-semiconductor on a P-type substrate at the same time without raising costs too drastically.

BRIEF SUMMARY OF THE INVENTION

The present disclosure provides a semiconductor device, including a first conductive type substrate, a second conductive type body region, a first conductive type first well region, a gate structure, a source region, and a drain region. The second conductive type body region is disposed in the first conductive type substrate, wherein the first conductive type is different from the second conductive type. The first conductive type first well region is disposed in the second conductive type body region. The gate structure is disposed over the top surface of the first conductive type substrate. The source region includes a heavily-doped first conductive type source region. The source region is disposed in the second conductive type body region. The drain region is a heavily doped first conductive type, and is disposed in the first conductive type first well region.

The present disclosure also provides a method for manufacturing a semiconductor device, including: providing a first conductive type substrate; forming a second conductive type body region in the first conductive type substrate, wherein the first conductive type is different from the second conductive type; forming a first conductive type first well region in the second conductive type body region; forming a gate structure over the top surface of the first conductive type substrate; forming a source region, wherein the source region includes a heavily-doped first conductive type source region and is disposed in the second conductive type body region; and forming a drain region, wherein the drain region is heavily doped first conductive type and is disposed in the first conductive type first well region.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE INVENTION

Figure 1:
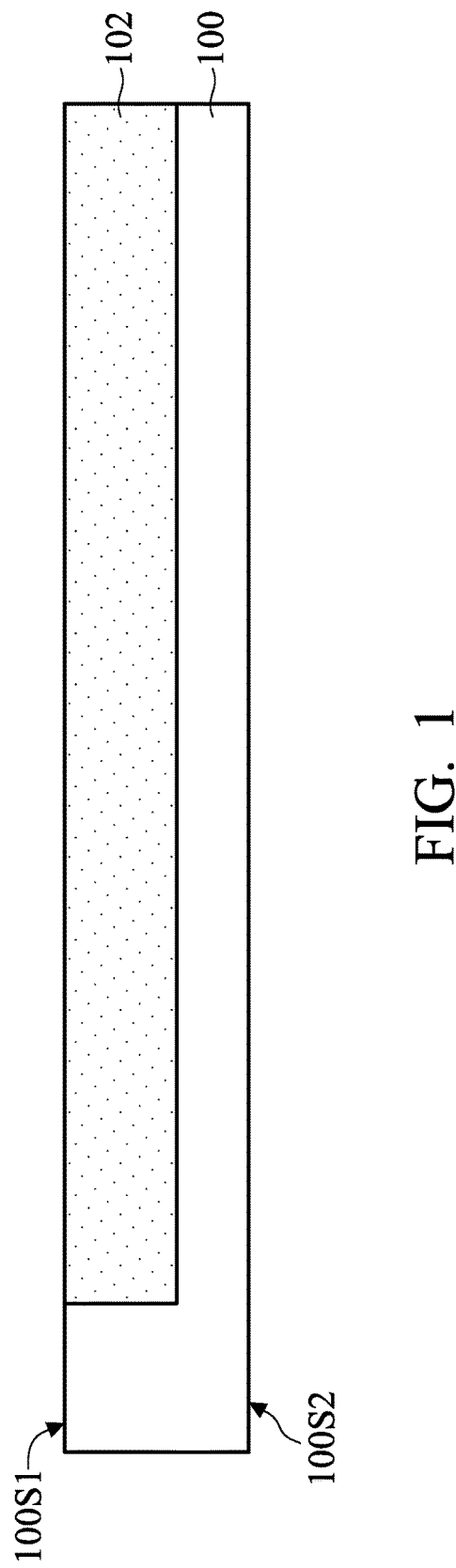
FIG. 1 is a cross-sectional view of a semiconductor device in one step of a manufacturing method of the semiconductor device according to some embodiments of the present disclosure.

The semiconductor device of the present disclosure and the method for manufacturing this semiconductor device are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a semiconductor wafer and the layers overlying the wafer. All semiconductor element needed may be already formed over the substrate. However, the substrate is represented with a flat surface in order to simplify the drawing. The term "substrate surface" is meant to include the uppermost exposed layers on a semiconductor wafer, such as silicon surface, and insulating layer and/or metallurgy lines.

The embodiment of the present disclosure utilizes a novel configuration of doped regions in the P-type substrate to form P-type metal-oxide-semiconductor in a P-type substrate. In coordination with the known technology that forms N-type metal-oxide-semiconductor in a P-type substrate, the N-type metal-oxide-semiconductor and P-type metal-oxide-semiconductor may be formed in the P-type substrate at the same time.

In addition, since the embodiment of the present disclosure only utilizes the novel configuration of doped regions in the P-type substrate to form P-type metal-oxide-semiconductor in the P-type substrate, the manufacturing processes of the present disclosure is simple. In addition, the manufacturing processes of the present disclosure may form the N-type metal-oxide-semiconductor and P-type metal-oxide-semiconductor in the P-type substrate at the same time without increasing the number of masks and without raising costs too drastically, or even at all.

FIG. 1 is a cross-sectional view of a semiconductor device in one step of a manufacturing method of the semiconductor device according to some embodiments of the present disclosure. Referring to FIG. 1, a first conductive type substrate 100 is provided first. The first conductive type substrate 100 may include, but is not limited to, semiconductor substrate such as a silicon substrate. In addition, the first conductive type substrate 100 may include an element semiconductor which may include germanium; a compound semiconductor which may include gallium nitride (GaN), silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy; or a combination thereof. In addition, the first conductive type substrate 100 may include a semiconductor-on-insulator. In some embodiments of the present disclosure, the first conductive type substrate 100 may be a lightly doped P-type substrate.

In the described embodiments, the term "lightly doped" means an impurity concentration within about $10^{11}/cm^3$ to about $10^{13}/cm^3$, for example about $10^{12}/cm^3$. One skilled in the art will recognize, however, that "lightly doped" is a term of art that depends upon the specific device type, technology generation, minimum feature size, and the like. It is intended, therefore, that the term be interpreted in light of the technology being evaluated and not be limited to the described embodiments.

Still referring to FIG. 1, a second conductive type body region 102 is formed in the first conductive type substrate 100. The first conductive type is different from the second conductive type. For example, in some embodiments of the present disclosure, the second conductive type is N-type, and the first conductive type is P-type.

The second conductive type body region 102 may be formed by ion implantation. For example, when the second conductive type is N-type, the predetermined region for the second conductive type body region 102 may be implanted with phosphorous ions or arsenic ions to form the second conductive type body region 102. In addition, the second conductive type body region 102 may be in direct contact with the top surface 100S1 of the first conductive type substrate 100.

It should be noted that, unless specifically defined as "lightly doped" or "heavily doped", the doped region has impurity concentration within about $10^{14}/cm^3$ to about $10^{16}/cm^3$, for example about $10^{15}/cm^3$. In other words, in some embodiments, the second conductive type body region 102 may have an impurity concentration within about $10^{14}/cm^3$ to about $10^{16}/cm^3$, for example about $10^{15}/cm^3$. One skilled in the art will recognize, however, that "doped region" is a term of art that depends upon the specific device type, technology generation, minimum feature size, and the like. It is intended, therefore, that the term be interpreted in light of the technology being evaluated and not be limited to the described embodiments.

Figure 2:
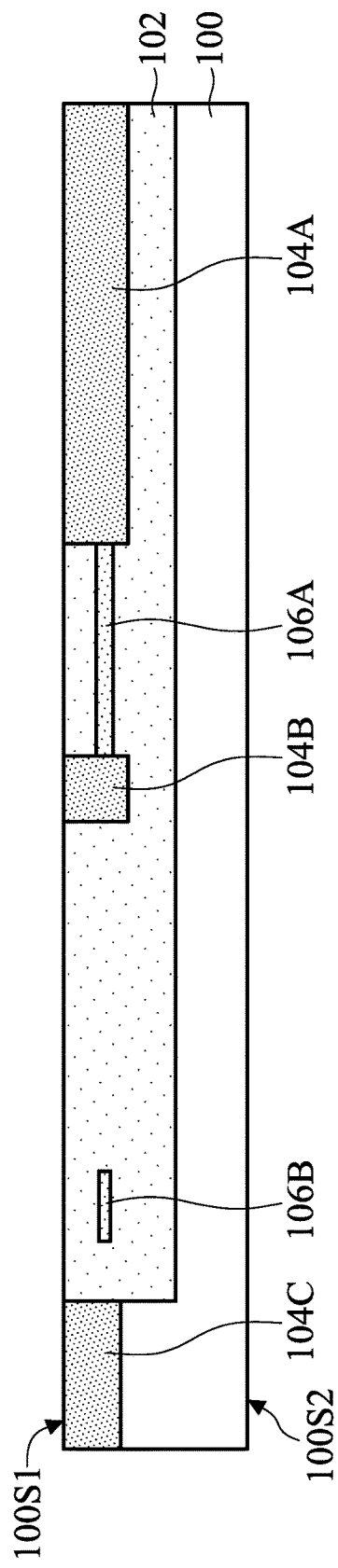
FIG. 2 is a cross-sectional view of a semiconductor device in one step of a manufacturing method of the semiconductor device according to some embodiments of the present disclosure.

FIG. 2 is a cross-sectional view of a semiconductor device in one step of a manufacturing method of the semiconductor device according to some embodiments of the present disclosure. As shown in FIG. 2, a first conductive type first well region 104A and a first conductive type second well region 104B are formed in the second conductive type body region 102. In addition, a first conductive type third well region 104C is formed in a region of the first conductive type substrate 100 where the second conductive type body region 102 is not formed. In some embodiments of the present disclosure, the first conductive type first well region 104A and the first conductive type third well region 104C are formed on opposite sides of the first conductive type second well region 104B.

In some embodiments of the present disclosure, the first conductive type first well region 104A, the first conductive type second well region 104B and the first conductive type third well region 104C may be in direct contact with the top surface 100S1 of the first conductive type substrate 100. In addition, the first conductive type third well region 104C may be in direct contact with the second conductive type body region 102, as shown in FIG. 2.

In some embodiments of the present disclosure, the first conductive type first well region 104A, the first conductive type second well region 104B and the first conductive type third well region 104C may be formed by ion implantation. For example, when the first conductive type is P-type, the predetermined region for the first conductive type first well region 104A, the first conductive type second well region 104B and the first conductive type third well region 104C may be implanted with boron ion, indium ion or boron difluoride ion ($BF_2^+$) to form the first conductive type first well region 104A, the first conductive type second well region 104B and the first conductive type third well region 104C.

In addition, in some embodiments of the present disclosure, the first conductive type first well region 104A, the first conductive type second well region 104B and the first conductive type third well region 104C may have an impurity concentration within about $10^{14}/cm^3$ to about $10^{16}/cm^3$, for example about $10^{15}/cm^3$. In addition, the doping concentration of the first conductive type first well region 104A, the first conductive type second well region 104B and the first conductive type third well region 104C may be greater than the doping concentration of the second conductive type body region 102.

Still referring to FIG. 2, a first conductive type first doped region 106A and a first conductive type second doped region 106B are formed in the second conductive type body region 102. In some embodiments of the present disclosure, as shown in FIG. 2, the first conductive type first doped region 106A is formed between the first conductive type first well region 104A and the first conductive type second well region 104B. In addition, the first conductive type first doped region 106A is in direct contact with the first conductive type first well region 104A and the first conductive type second well region 104B. In addition, the first conductive type first well region 104A and the first conductive type second well region 104B are electrically connected to each other by the first conductive type first doped region 106A. In addition, the first conductive type first doped region 106A does not contact the top surface 100S1 of the first conductive type substrate 100 and subsequent field oxide layer.

In addition, in some embodiments of the present disclosure, the first conductive type second doped region 106B is disposed between the first conductive type second well region 104B and the first conductive type third well region 104C. The first conductive type second doped region 106B only contacts the second conductive type body region 102, and does not contact any other doped regions shown in FIG. 2 and any other subsequent doped region. In other words, the first conductive type second doped region 106B is not electrically connected to any other doped region. And the first conductive type second doped region 106B forms a reduced surface field structure (RESURF structure) with the second conductive type body region 102. Due to the reduced surface field structure, the embodiments of the present disclosure may further reduce the surface field in the device and may further increase the breakdown voltage of the device.

In addition, in some embodiments of the present disclosure, the first conductive type second doped region 106B does not contact the top surface 100S1 of the first conductive type substrate 100 or the subsequent field oxide layer.

In addition, in some embodiments of the present disclosure, the first conductive type first doped region 106A and the first conductive type second doped region 106B may have an impurity concentration within about $10^{14}/cm^3$ to about $10^{16}/cm^3$, for example about $10^{15}/cm^3$. In addition, the doping concentration of the first conductive type first well region 104A, the first conductive type second well region 104B and the first conductive type third well region 104C may be greater than the doping concentration of the first conductive type first doped region 106A and the first conductive type second doped region 106B. The doping concentration of the first conductive type first doped region 106A and the first conductive type second doped region 106B may be greater than the doping concentration of the second conductive type body region 102.

Figure 3:
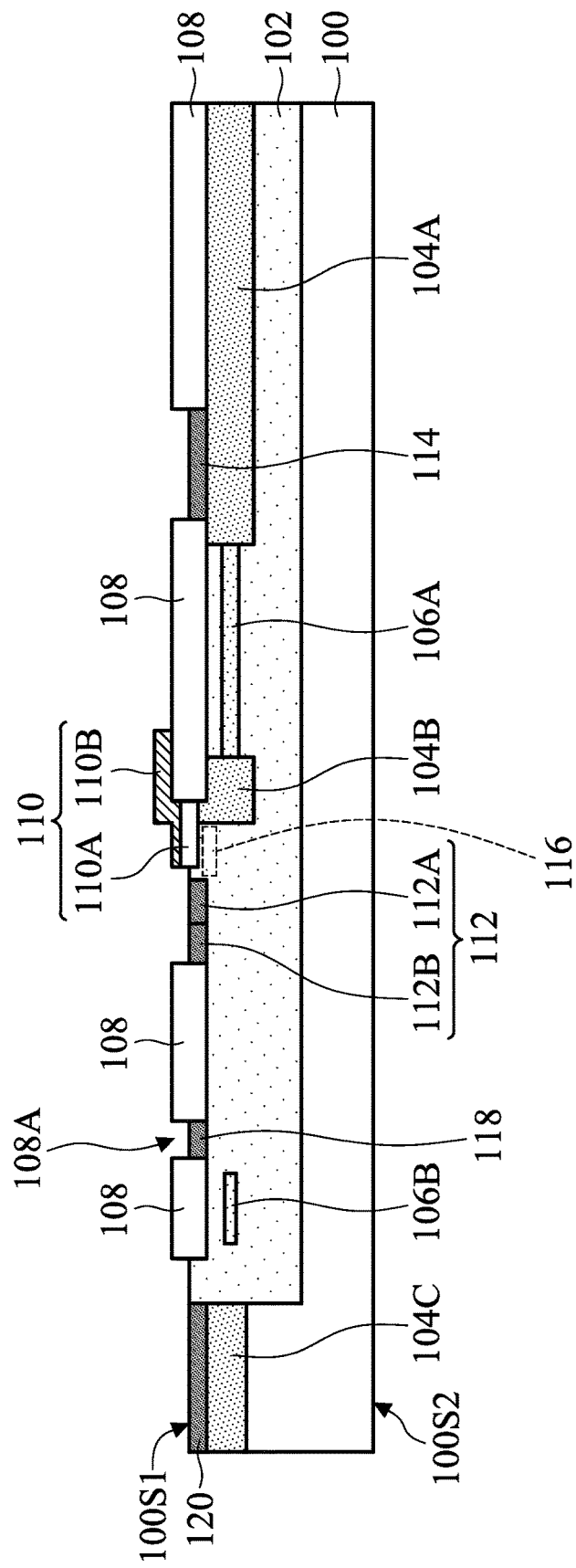
FIG. 3 is a cross-sectional view of a semiconductor device in one step of a manufacturing method of the semiconductor device in accordance with some embodiments of the present disclosure.

Subsequently, referring to FIG. 3, a field oxide layer 108 is formed over the top surface 100S1 of the first conductive type substrate 100. The material of the field oxide layer 108 may include, but is not limited to, silicon oxide. In some embodiments of the present disclosure, the field oxide layer 108 may be formed over the top surface 100S1 of the first conductive type substrate 100 by thermal oxidation. However, in other embodiments of the present disclosure, the field oxide layer 108 may be formed by chemical vapor deposition or spin-on coating and patterning steps.

Subsequently, a gate structure 110 is formed over the top surface 100S1 of the first conductive type substrate 100. The gate structure 110 includes a gate dielectric layer 110A and a gate electrode 110B formed over the gate dielectric layer 110A. In particular, the gate structure 110 is formed over the first conductive type second well region 104B and the field oxide layer 108 contacting the first conductive type second well region 104B. Since there is a height difference between the field oxide layer 108 and the top surface 100S1 of the first conductive type substrate 100, there is also a height difference between the field oxide layer 108 and the gate dielectric layer 110A. Therefore, the gate structure 110 (or the gate electrode 110B) has a stepped shape. In addition, the first conductive type second well region 104B is disposed under the gate structure 110.

The material of the gate dielectric layer 110A may include, but is not limited to, silicon oxide, silicon nitride, silicon oxynitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, any other suitable high-k dielectric material, or a combination thereof. The gate dielectric layer 110A may be formed by thermal oxidation, chemical vapor deposition or spin-on coating. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

The material of the gate electrode 110B may include, but is not limited to, amorphous silicon, poly-silicon, one or more metal, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The gate electrode 110B may include, but is not limited to, ruthenium oxide or indium tin oxide. The conductive material layer may be formed by the previously described chemical vapor deposition (CVD), sputtering, resistive thermal evaporation, electron beam evaporation, or any other suitable methods. For example, in one embodiment, the amorphous silicon conductive material layer or poly-silicon conductive material layer may be deposited and formed by low-pressure chemical vapor deposition at about 525° C.-650° C. The thickness of the amorphous silicon conductive material layer or poly-silicon conductive material layer may range from about 1000 Å to 10000 Å.

Subsequently, still referring to FIG. 3, a source region 112 is formed in the second conductive type body region 102 and a drain region 114 is formed in the first conductive type first well region 104A. The source region 112 and the drain region 114 are disposed on opposite sides of the gate structure 110. In some embodiments of the present disclosure, the source region 112 is disposed between the gate structure 110 and the first conductive type second doped region 106B or between the gate structure 110 and the first conductive type third well region 104C.

The drain region 114 is the heavily doped first conductive type. The source region 112 includes a heavily-doped first conductive type source region 112A and a heavily-doped second conductive type source region 112B being in direct contact with the heavily-doped first conductive type source region 112A. The heavily-doped first conductive type source region 112A is closer to the gate structure 110, whereas the heavily-doped second conductive type source region 112B is farther from the gate structure 110.

In some embodiments of the present disclosure, the drain region 114 and the heavily-doped first conductive type source region 112A may be formed by ion implantation. For example, when the first conductive type is P-type, the predetermined region for the drain region 114 and the heavily-doped first conductive type source region 112A may be implanted with boron ion, indium ion or boron difluoride ion ($BF_2^+$) to form the drain region 114 and the heavily-doped first conductive type source region 112A.

In addition, in some embodiments of the present disclosure, the heavily-doped second conductive type source region 112B may be formed by ion implantation. For example, when the second conductive type is N-type, the predetermined region for the heavily-doped second conductive type source region 112B may be implanted with phosphorous ions or arsenic ions to form the heavily-doped second conductive type source region 112B.

In the described embodiments, the term "heavily doped" means an impurity concentration of above about $10^{19}$/cm$^3$, for example from about $10^{19}$/cm$^3$ to about $10^{21}$/cm$^3$. One skilled in the art will recognize, however, that "heavily doped" is a term of art that depends upon the specific device type, technology generation, minimum feature size, and the like. It is intended, therefore, that the term be interpreted in light of the technology being evaluated and not be limited to the described embodiments.

In addition, a first conductive type channel region 116 is formed under the gate structure 110. The first conductive type channel region 116 is disposed in the first conductive type substrate 100 (or in the second conductive type body region 102) between the heavily-doped first conductive type source region 112A and the first conductive type second well region 104B. In some embodiments of the present disclosure, when the first conductive type is P-type and the second conductive type is N-type, the first conductive type channel region 116 is a P-type channel. In this embodiment, the gate structure 110, the source region 112 and the drain region 114 together form a P-type metal-oxide-semiconductor (PMOS), and the first conductive type substrate 100 is a P-type substrate.

Therefore, the embodiment of the present disclosure utilizes a novel configuration of doped regions in the P-type substrate to form P-type metal-oxide-semiconductor in a P-type substrate. In coordination with the known technology that forms N-type metal-oxide-semiconductor in a P-type substrate, the N-type metal-oxide-semiconductor and P-type metal-oxide-semiconductor may be formed in the P-type substrate at the same time.

In addition, since the embodiment of the present disclosure only utilizes the novel configuration of doped regions in the P-type substrate to form P-type metal-oxide-semiconductor in the P-type substrate, the manufacturing processes of the present disclosure is simple. In addition, the manufacturing processes of the present disclosure may form the N-type metal-oxide-semiconductor and P-type metal-oxide-semiconductor in the P-type substrate at the same time without increasing the number of masks, and without raising costs too drastically, or even at all.

In some embodiments of the present disclosure, by using the novel configuration of doped regions, the semiconductor device in some embodiments of the present disclosure has a breakdown voltage greater than or equal to 710V, and the on-resistance of the semiconductor device in some embodiments of the present disclosure may be smaller than or equal to 570 mohm-cm$^2$. In addition, in some embodiments of the present disclosure, the thickness of the first conductive type substrate 100 of the semiconductor device in some embodiments of the present disclosure may be greater than 100 μm. Therefore, the depletion region of the reduced surface field structure formed by the first conductive type second doped region 106B and the second conductive type body region 102 would not contact the bottom surface 100S2 of the first conductive type substrate 100 and affect the performance of the device.

Subsequently, still referring to FIG. 3, a second conductive type heavily-doped region 118 may be further formed in the second conductive type body region 102. The second conductive type heavily-doped region 118 is formed in the opening 108A of the field oxide layer 108. In addition, the second conductive type heavily-doped region 118 is disposed between the first conductive type second doped region 106B and the heavily-doped second conductive type source region 112B. In addition, in some embodiments of the present disclosure, the first conductive type second doped region 106B and the heavily-doped first conductive type source region 112A are disposed on opposite sides of the second conductive type heavily-doped region 118.

In some embodiments of the present disclosure, the second conductive type heavily-doped region 118 may be formed by ion implantation. For example, when the second conductive type is N-type, the predetermined region for the second conductive type heavily-doped region 118 may be implanted with phosphorous ions or arsenic ions to form the second conductive type heavily-doped region 118.

Subsequently, still referring to FIG. 3, a first conductive type heavily-doped region 120 may be formed in the first conductive type third well region 104C. In some embodiments of the present disclosure, the first conductive type heavily-doped region 120 may be in direct contact with the second conductive type body region 102.

The first conductive type heavily-doped region 120 may be formed by ion implantation. For example, when the first conductive type is P-type, the predetermined region for the first conductive type heavily-doped region 120 may be implanted with boron ion, indium ion or boron difluoride ion ($BF_2^+$) to form the first conductive type heavily-doped region 120.

In addition, in some embodiments of the present disclosure, the doping concentration of the second conductive type heavily-doped region 118 and the first conductive type heavily-doped region 120 is similar to or the same as the doping concentration of the source region 112 and the drain region 114.

Figure 4:
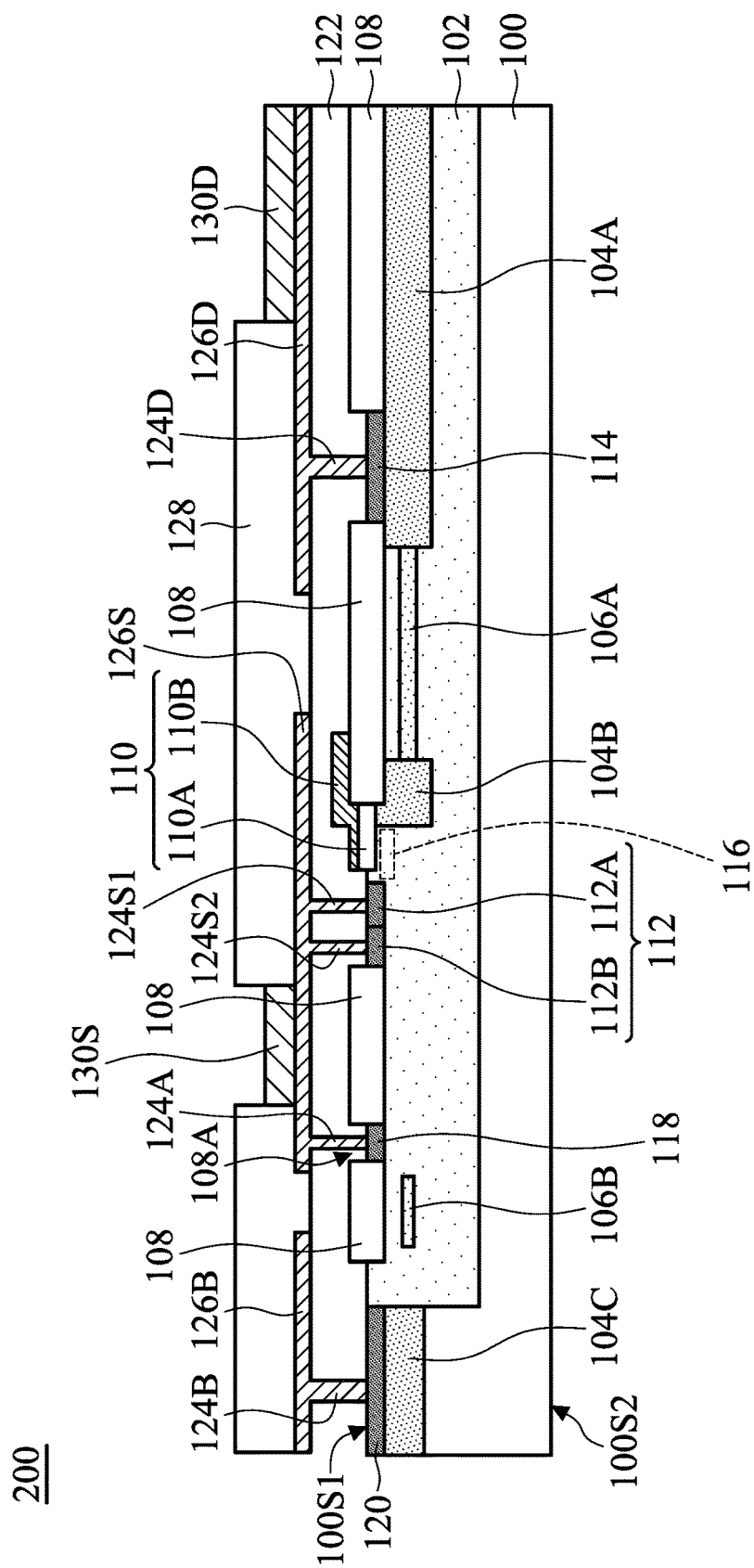
FIG. 4 is a cross-sectional view of a semiconductor device in one step of a manufacturing method of the semiconductor device according to some embodiments of the present disclosure.

Subsequently, FIG. 4 is a cross-sectional view of a semiconductor device 200 in one step of a manufacturing method of the semiconductor device 200 according to some embodiments of the present disclosure. Referring to FIG. 4, an interlayer dielectric layer 122 is formed over the top surface 100S1 of the first conductive type substrate 100. The material of the interlayer dielectric layer 122 may include, but is not limited to, silicon oxide, silicon nitride, silicon oxynitride, boron phosphorus silicate glass (BPSG), phosphorus silicate glass (PSG), spin-on glass (SOG), dielectric material formed by high density plasma, or any other suitable dielectric material, or a combination thereof. The interlayer dielectric layer 122 may be formed by the previously described chemical vapor deposition or spin-on coating and patterning steps.

Subsequently, still referring to FIG. 4, a drain contact plug 124D, a first source contact plug 124S1, a second source contact plug 124S2, a contact plug 124A and a body contact plug 124B are formed in the interlayer dielectric layer 122. The drain contact plug 124D is electrically connected to the drain region 114. The first source contact plug 124S1 is electrically connected to the heavily-doped first conductive type source region 112A. The second source contact plug 124S2 is electrically connected to the heavily-doped second conductive type source region 112B. The contact plug 124A is electrically connected to the second conductive type heavily-doped region 118. The body contact plug 124B is electrically connected to the first conductive type heavily-doped region 120.

In addition, a wire 126D electrically connected to the drain contact plug 124D is formed over the interlayer dielectric layer 122. A wire 126S electrically connected to the first source contact plug 124S1, the second source contact plug 124S2 and the contact plug 124A is formed over the interlayer dielectric layer 122. A wire 126B electrically connected to the body contact plug 124B is formed over the interlayer dielectric layer 122.

In some embodiments of the present disclosure, the drain contact plug 124D, the first source contact plug 124S1, the second source contact plug 124S2, the contact plug 124A, the body contact plug 124B and the wire 126D, 126S and 126B may include, but are not limited to, copper, aluminum, tungsten, gold, chromium, nickel, platinum, titanium, iridium, rhodium, an alloy thereof, a combination thereof, or any other conductive material. In other embodiments, the drain contact plug 124D, the first source contact plug 124S1, the second source contact plug 124S2, the contact plug 124A, the body contact plug 124B and the wire 126D, 126S and 126B includes a nonmetal material as long as the material is conductive. The drain contact plug 124D, the first source contact plug 124S1, the second source contact plug 124S2, the contact plug 124A, the body contact plug 124B and the wire 126D, 126S and 126B may include any conductive material. The material of the drain contact plug 124D, the first source contact plug 124S1, the second source contact plug 124S2, the contact plug 124A, the body contact plug 124B and the wire 126D, 126S and 126B may be formed by chemical vapor deposition (CVD), sputtering, resistive thermal evaporation, electron beam evaporation, or any other suitable method.

In addition, in some embodiments of the present disclosure, the body contact plug 124B and the wire 126B electrically connected to the first conductive type substrate 100 through the first conductive type heavily-doped region 120 and the first conductive type third well region 104C. Thereby, the body contact plug 124B and the wire 126B may electrically connect the first conductive type substrate 100 to the ground.

In addition, a protection layer 128 is formed over the interlayer dielectric layer 122. The material of the protection layer 128 may include, but is not limited to, silicon oxide, silicon nitride, silicon oxynitride, boron phosphorus silicate glass (BPSG), phosphorus silicate glass (PSG), spin-on glass (SOG), dielectric material formed by high density plasma, or any other suitable dielectric material, or a combination thereof. The protection layer 128 may be formed by the previously described method.

The protection layer 128 covers the wire 126D, 126S and 126B and has an opening which exposes the wire 126D and the wire 126S. In addition, a conductive pad 130D which is electrically connected to the wire 126D and a conductive pad 130S which is electrically connected to the wire 126S may be formed in the opening of the protection layer 128. The conductive pad 130D is formed over the wire 126D. The conductive pad 130S is formed over the wire 126S.

The conductive pad 130D and 130S may include, but is not limited to, copper, aluminum, tungsten, gold, chromium, nickel, platinum, titanium, iridium, rhodium, an alloy thereof, a combination thereof, or any other conductive material. In other embodiments, the conductive pad 130D and 130S includes a nonmetal material as long as the material is conductive. The conductive pad 130D and 130S may include any conductive material. The material of the conductive pad 130D and 130S may be formed by chemical vapor deposition (CVD), sputtering, resistive thermal evaporation, electron beam evaporation, or any other suitable method. In some embodiments, the materials of the conductive pad 130D and 130S may be the same, and the conductive pad 130D and 130S may be formed by the same deposition steps. However, in other embodiments, the conductive pad 130D and 130S may be formed by different deposition steps, and the materials of the conductive pad 130D and 130S may be different from each other.

Still referring to FIG. 4, the semiconductor device 200 includes the first conductive type substrate 100 and the second conductive type body region 102 disposed in the first conductive type substrate 100. The semiconductor device 200 further includes the first conductive type first well region 104A and the first conductive type second well region 104B disposed in the second conductive type body region 102, and the first conductive type third well region 104C disposed in a region of the first conductive type substrate 100 where the second conductive type body region 102 is not formed. The first conductive type first well region 104A and the first conductive type third well region 104C are disposed on opposite sides of the first conductive type second well region 104B.

The semiconductor device 200 further includes the first conductive type first doped region 106A and the first conductive type second doped region 106B disposed in the second conductive type body region 102. The first conductive type first doped region 106A is disposed between the first conductive type first well region 104A and the first conductive type second well region 104B. The first conductive type first doped region 106A is in direct contact with the first conductive type first well region 104A and the first conductive type second well region 104B, and the first conductive type first well region 104A and the first conductive type second well region 104B are electrically connected to each other by the first conductive type first doped region 106A.

The first conductive type second doped region 106B is disposed between the first conductive type second well region 104B and the first conductive type third well region 104C. The first conductive type second doped region 106B only contacts the second conductive type body region 102, and does not contact other doped regions such as the first conductive type second well region 104B and the first conductive type third well region 104C.

The semiconductor device 200 further includes the gate structure 110 disposed over the top surface 100S1 of the first conductive type substrate 100. The gate structure 110 is disposed over the first conductive type second well region 104B. Subsequently, the semiconductor device 200 further includes the source region 112 and the drain region 114. The source region 112 and the drain region 114 are disposed at the opposite sides of the gate structure 110. In particular, the source region 112 is disposed in the second conductive type body region 102. The source region 112 is disposed between the gate structure 110 and the first conductive type second doped region 106B or between the gate structure 110 and the first conductive type third well region 104C. The drain region 114 is disposed in the first conductive type first well region 104A.

In addition, the source region 112 includes the heavily-doped first conductive type source region 112A and the heavily-doped second conductive type source region 112B which is in direct contact with the heavily-doped first conductive type source region 112A. The heavily-doped first conductive type source region 112A is closer to the gate structure 110, whereas the heavily-doped second conductive type source region 112B is farther from the gate structure 110.

The semiconductor device 200 further includes the first conductive type channel region 116 disposed under the gate structure 110 and disposed between the heavily-doped first conductive type source region 112A and the first conductive type second well region 104B. In some embodiments of the present disclosure, when the first conductive type is P-type and the second conductive type is N-type, the first conductive type channel region 116 is a P-type channel. In this embodiment, the gate structure 110, the source region 112 and the drain region 114 together form a P-type metal-oxide-semiconductor (PMOS), and the first conductive type substrate 100 is a P-type substrate.

The semiconductor device 200 further includes the second conductive type heavily-doped region 118 disposed in the second conductive type body region 102. The second conductive type heavily-doped region 118 is disposed between the first conductive type second doped region 106B and the heavily-doped second conductive type source region 112B. The semiconductor device 200 further includes the first conductive type heavily-doped region 120 disposed in the first conductive type third well region 104C.

In addition, in some embodiments of the present disclosure, the semiconductor device 200 may be a high-voltage semiconductor devices such as a laterally diffused metal oxide semiconductor (LDMOS). In some embodiments of the present disclosure, the semiconductor device 200 uses the P-type substrate 100. In addition to the P-type metal-oxide-semiconductor (PMOS), the semiconductor device 200 may further include an N-type metal-oxide-semiconductor (NMOS).

In summary, the embodiment of the present disclosure utilizes a novel configuration of doped regions in the P-type substrate to form P-type metal-oxide-semiconductor in a P-type substrate. In coordination with the known technology that forms N-type metal-oxide-semiconductor in a P-type substrate, the N-type metal-oxide-semiconductor and P-type metal-oxide-semiconductor may be formed in the P-type substrate at the same time.

In addition, since the embodiment of the present disclosure only utilizes the novel configuration of doped regions in the P-type substrate to form P-type metal-oxide-semiconductor in the P-type substrate, the manufacturing processes of the present disclosure is simple. In addition, the manufacturing processes of the present disclosure may form the N-type metal-oxide-semiconductor and P-type metal-oxide-semiconductor in the P-type substrate at the same time without increasing the number of masks, and without raising costs too drastically, or even at all.

In addition, it should be noted that the drain and source mentioned above in the present disclosure are switchable since the definition of the drain and source is related to the voltage connecting thereto.

Note that the above element sizes, element parameters, and element shapes are not limitations of the present disclosure. Those skilled in the art can adjust these settings or values according to different requirements. It should be understood that the semiconductor device and method for manufacturing the same of the present disclosure are not limited to the configurations of FIGS. 1 to 4. The present disclosure may merely include any one or more features of any one or more embodiments of FIGS. 1 to 4. In other words, not all of the features shown in the figures should be implemented in the semiconductor device and method for manufacturing the same of the present disclosure.

In addition, although the doping concentrations of various doped region in some embodiments have been described previously, one skilled in the art will recognize, however, that the doping concentrations of various doped region depend upon the specific device type, technology generation, minimum feature size, and the like. It is intended, therefore, that the doping concentrations of various doped region may be interpreted in light of the technology being evaluated and not be limited to the described embodiments.

It should be noted that although the above description merely illustrates embodiments with the first conductive type being P-type and the second conductive type being N-type, those skilled in the art will appreciate that the first conductive type may be N-type with the second conductive type being P-type.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a first conductive type substrate;
   a second conductive type body region disposed in the first conductive type substrate, wherein the first conductive type is different from the second conductive type;
   a first conductive type first well region disposed in the second conductive type body region;
   a gate structure disposed over a top surface of the first conductive type substrate;
   a source region, wherein the source region comprises a heavily-doped first conductive type source region and is disposed in the second conductive type body region;
   a drain region, wherein the drain region is heavily doped first conductive type and is disposed in the first conductive type first well region; and
   a first conductive type second doped region disposed in the second conductive type body region, wherein the first conductive type second doped region only contacts the second conductive type body region and does not contact other doped regions.

2. The semiconductor device as claimed in claim 1, wherein the first conductive type is P-type, and the second conductive type is N-type, wherein the semiconductor device further comprises a P-type channel disposed between the source region and the drain region and disposed under the gate structure.

3. The semiconductor device as claimed in claim 1, further comprising:
   a first conductive type second well region disposed in the second conductive type body region, wherein the first conductive type second well region is disposed under the gate structure; and
   a first conductive type first doped region disposed in the second conductive type body region, wherein the first conductive type first well region and the first conductive type second well region are electrically connected to each other by the first conductive type first doped region.

4. The semiconductor device as claimed in claim 3, wherein the first conductive type first doped region does not contact the top surface of the first conductive type substrate.

5. The semiconductor device as claimed in claim 1, wherein the first conductive type second doped region does not contact the top surface of the first conductive type substrate.

6. The semiconductor device as claimed in claim 1, wherein the source region further comprises:
   a heavily-doped second conductive type source region being in direct contact with the heavily-doped first conductive type source region.

7. The semiconductor device as claimed in claim 1, further comprising:
   a second conductive type heavily-doped region disposed in the second conductive type body region, wherein the first conductive type second doped region and the heavily-doped first conductive type source region are disposed at opposite sides of the second conductive type heavily-doped region.

8. The semiconductor device as claimed in claim 1, further comprising:
   a first conductive type third well region disposed in a region of the first conductive type substrate where the second conductive type body region is not formed.

9. The semiconductor device as claimed in claim 8, further comprising: a first conductive type heavily-doped region disposed in the first conductive type third well region.

10. A method for manufacturing a semiconductor device, comprising:
    providing a first conductive type substrate;
    forming a second conductive type body region in the first conductive type substrate, wherein the first conductive type is different from the second conductive type;
    forming a first conductive type first well region in the second conductive type body region;
    forming a gate structure over a top surface of the first conductive type substrate;
    forming a source region, wherein the source region comprises a heavily-doped first conductive type source region and is disposed in the second conductive type body region;
    forming a drain region, wherein the drain region is heavily doped first conductive type and is disposed in the first conductive type first well region; and
    forming a first conductive type second doped region in the second conductive type body region, wherein the first conductive type second doped region only contacts the second conductive type body region and does not contact other doped regions.

11. The method for manufacturing the semiconductor device as claimed in claim 10, wherein the first conductive type is P-type, and the second conductive type is N-type, wherein the semiconductor device further comprises a P-type channel disposed between the source region and the drain region and disposed under the gate structure.

12. The method for manufacturing the semiconductor device as claimed in claim 10, further comprising:
    forming a first conductive type second well region in the second conductive type body region, wherein the first conductive type second well region is disposed under the gate structure; and
    forming a first conductive type first doped region in the second conductive type body region, wherein the first conductive type first well region and the first conductive type second well region are electrically connected to each other by the first conductive type first doped region.

13. The method for manufacturing the semiconductor device as claimed in claim 12, wherein the first conductive type first doped region does not contact the top surface of the first conductive type substrate.

14. The method for manufacturing the semiconductor device as claimed in claim 10, wherein the first conductive type second doped region does not contact the top surface of the first conductive type substrate.

15. The method for manufacturing the semiconductor device as claimed in claim 10, wherein the source region further comprises:
 a heavily-doped second conductive type source region being in direct contact with the heavily-doped first conductive type source region.

16. The method for manufacturing the semiconductor device as claimed in claim 10, further comprising:
 forming a second conductive type heavily-doped region in the second conductive type body region, wherein the first conductive type second doped region and the heavily-doped first conductive type source region are disposed at opposite sides of the second conductive type heavily-doped region.

17. The method for manufacturing the semiconductor device as claimed in claim 10, further comprising:
 forming a first conductive type third well region in a region of the first conductive type substrate where the second conductive type body region is not formed.

18. The method for manufacturing the semiconductor device as claimed in claim 17, further comprising:
 forming a first conductive type heavily-doped region in the first conductive type third well region.

* * * * *